United States Patent [19]

Hosaka et al.

[11] 4,384,037
[45] May 17, 1983

[54] POSITIVE TYPE PHOTOSENSITIVE RESIN COMPOSITION

[75] Inventors: Yoshihiro Hosaka; Yoichi Kamoshida, both of Yokohama; Yoshiyuki Harita, Kawasaki; Kunihiro Harada, Machida, all of Japan

[73] Assignee: Japan Synthetic Rubber Co., Ltd., Tokyo, Japan

[21] Appl. No.: 239,339

[22] Filed: Mar. 2, 1981

[30] Foreign Application Priority Data

Mar. 1, 1980 [JP] Japan ............................. 55-25629

[51] Int. Cl.³ .............................................. G03C 1/54
[52] U.S. Cl. ..................................... 430/191; 430/192; 430/165; 430/326; 430/331; 430/905; 430/907; 430/910
[58] Field of Search ................ 430/192, 190, 165, 907, 430/905, 288, 326, 191, 286, 910

[56] References Cited

U.S. PATENT DOCUMENTS

| | | | |
|---|---|---|---|
| 3,551,154 | 12/1970 | DiBlas et al. | 430/192 |
| 3,900,325 | 8/1975 | Christensen et al. | 430/192 |
| 3,902,906 | 9/1975 | Iwama et al. | 430/192 |
| 4,164,421 | 8/1979 | Shinozaki et al. | 430/165 |
| 4,177,074 | 12/1979 | Proskow | 430/905 |
| 4,294,905 | 10/1981 | Okishi et al. | 430/192 |

*Primary Examiner*—Charles L. Bowers, Jr.
*Attorney, Agent, or Firm*—Oblon, Fisher, Spivak, McClelland & Maier

[57] ABSTRACT

A photosensitive resin composition comprising a 1,2-quanonediazide compound and a copolymer consisting essentially of (A) a conjugated diolefinic compound, (B) a monoolefinically unsaturated compound and (C) an α,β-ethylenically unsaturated carboxylic acid. Said composition can provide a positive type resist which is difficult to break and excellent in adhesion to a substrate.

14 Claims, 4 Drawing Figures

POSITIVE TYPE PHOTOSENSITIVE RESIN COMPOSITION

This invention relates to a positive type photosensitive resin composition. More particularly, it relates to a photosensitive resin composition capable of providing a positive type resist difficult to break and excellent in adhesion to a substrate.

With the development of photo-lithographic technique, the degree of integration of integral circuits has been made higher and at the present time, it comes to be required that a 2 μm pattern size be reproduced when producing an integral circuit. Most of the resists used at present in this photo-lithographic technique are negative type resists obtained by adding a bisazide compound as a photo-crosslinking agent to a cyclized polyisoprene rubber. However, this type of resists are limited in resolution, so that it is difficult to resolve a 2 μm pattern.

It is positive type resist which can fulfil the above mentioned requirement. A positive type resist contains a 1,2-quinonediazide compound as a constituent. This compound absorbs ultraviolet rays upon exposure to light to form a ketene via a carbene as shown in the following scheme, and this ketene reacts with a slight quality of water present in the system to give indenecarboxylic acid, which is dissolved in an aqueous alkali solution used as a developing solution:

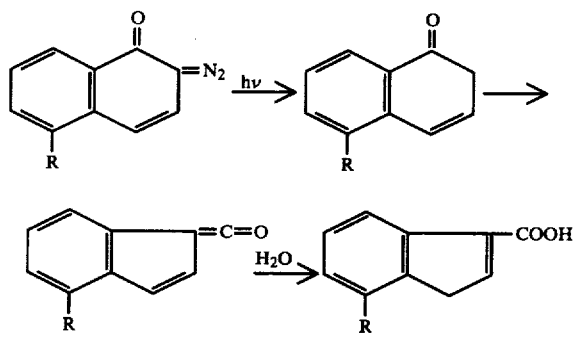

Said phenomenon is utilized in the positive type resist.

Thus, an aqueous alkali solution is used as a developing solution in the case of a positive type resist, owing to which the resolution can be enhanced without swelling the resist.

Such positive type resists can roughly be classified into (1) a mixture of a polymer soluble in an aqueous alkali solution and a 1,2-quinonediazide compound and (2) a polymer obtained by condensing the side chain of a polymer with a 1,2-quinonediazide compound.

Most of the alkali-soluble polymers used in the class (1) are phenolic resins synthesized from phenol, cresol or the like and formaldehyde. Although the phenolic resins per se are soluble in an aqueous alkali solution, the 1,2-quinonediazide compound added thereto is insoluble at all in the aqueous alkali solution before exposure to light, so that a mixture of both is very difficult to dissolve in an aqueous alkali solution. The 1,2-quinonediazide compound in the part exposed to ultraviolet rays changes into indenecarboxylic acid as mentioned above, owing to which the mixture becomes soluble in an aqueous alkali solution. Thus, a positive pattern can be obtained. Accordingly, photosensitivity and developability can be controlled by varying the amount of 1,2-quinonediazide compound added to the system.

On the other hand, those belonging to the class (2) include, for example, a condensate of polyaminostyrene and 1,2-quinonediazide compound (Japanese Patent Publication No. 34,681/74) and a condensate of polyhydroxystyrene and a 1,2-quinonediazide compound (Japanese Patent Application Kokai (Laid-Open) No. 113,305/75). Since the polymer has previously been condensed in said class, their photosensitivity and developability are more difficult to control than in the class (1) where the 1,2-quinonediazide compound is merely added.

For this reason, most of the commercially available positive type resists are those belonging to the class (1) wherein a phenolic resin is mixed with a 1,2-quinonediazide compound. However, said phenolic resin type positive resist has some faults as compared with the negative type resists.

One of the faults is the poor adhesion of the resists to a substrate such as silicon dioxide film or the like. Because of the poor adhesion, the developing solution permeates into the interface between the resist and the substrate in the course of development to cause peeling of the part which is to be left as a resist pattern. Even if said part can remain well, the subsequent wet etching process produces so great a side etch that the product is unusable as a resist. In order to eliminate this fault, a pretreatment for modifying the surface of the substrate is carried out by coating the substrate with a silylamine derivative such as hexamethyldisilazane and chloromethylsilane or the like.

Further, there is another fault that the resist film is hard and brittle. Thus, when the resist layer is intimately contacted with a mask and exposed to light, the phenolic resin type positive resist is readily broken owing to its poor flexibility. When the mask is removed a part of the broken resist is attached to the mask to spot the same. When the spotted mask is reused next time, therefore, an insufficient exposure is caused at the spot portion to form areas impossible to develop with an aqueous alkali solution on the resist.

The present inventors have conducted various studies on the above-mentioned problems to discover that all the above-mentioned problems can be solved by combining a 1,2-quinonediazide compound with a copolymer consisting essentially of a conjugated diolefinic compound, a monoolefinically unsaturated compound and an α,β-ethylenically unsaturated carboxylic acid. It has also been found that said photosensitive resin composition has a high photosensitivity when the copolymer has a narrow composition distribution which has been produced so that the standard deviations in the proportions of individual comonomers copolymerized (copolymer composition) are 3 or less at any time in the process of polymerization reaction.

According to this invention, there is provided a positive type photosensitive resin composition comprising a 1,2-quinonediazide compound and a copolymer consisting essentially of (A) a conjugated diolefinic compound, (B) a monoolefinically unsaturated compound and (C) an α,β-ethylenically unsaturated carboxylic acid.

If the positive type photosensitive resin composition of this invention is used, there can be obtained, owing to its quite excellent adhesion to a substrate a quite excellent positive type resist having an advantage that the resist pattern does not peel off in the course of development even if the substrate is not coated with a surface treating agent such as hexamethyldisilazane, the undercut after etching is very slight, and the breaking of the resist film and the adhesion of the resist film to a mask do not occur when it is exposed to light in contact with the mask.

The conjugated diolefinic compound (A) plays an important role in the constitutive polymer in the positive type photosensitive resin composition of this invention. That is to say, a flexibility characteristic of rubber can be given to the copolymer, so that a flexibility becomes possessed by the resist, the problem of breaking occurring in phenolic resin type positive resists disappears, and the yield of product can be improved markedly. Further, a flexibility can be given to the resist, so that the adhesive force of the resist to a silicon dioxide film is enhanced. As a result, the adhesive force between the resist layer and the substrate can be increased without using any surface treating agent, so that the peeling of the resist film does not occur at all at the time of development with an aqueous alkali solution or etching with an aqueous hydrogen fluoride solution.

As said conjugated diolefinic compound (A), there are preferably used 1,3-butadiene, isoprene, chloroprene, dimethylbutadiene and the like. They may be used alone or in admixture of two or more. The proportion of the conjugated diolefinic compound in the copolymer is preferably 5-60 mole % and particularly preferably 10-40 mole %.

If the proportion of the conjugated diolefinic compound in the copolymer is less than 5 mole %, the flexibility of the copolymer becomes so insufficient that the desired effect cannot be sufficiently obtained. If the proportion exceeds 60 mole %, the flexibility of the copolymer becomes so great as to cause a resist flow at the time of prebaking or post-baking and the hydrophobic property of the copolymer is increased to cause the decrease of the developability with an aqueous alkali solution. Therefore, these proportions are undesirable.

By adding said monoolefinically unsaturated compound (B) to the copolymer, the mechanical properties of the copolymer can be controlled appropriately and the solubility of the copolymer in an aqueous alkali solution can be controlled delicately in relation to the $\alpha,\beta$-ethylenically unsaturated carboxylic acid as mentioned hereinafter.

As said monoolefinically unsaturated compound, there may be used alkyl methacrylates such as methyl methacrylate, ethyl methacrylate, n-butyl methacrylate, sec-butyl methacrylate, t-butyl methacrylate and the like; alkyl acrylates such as methyl acrylate, isopropyl acrylate and the like; cycloalkyl methacrylates such as cyclohexyl methacrylate, 2-methylcyclohexyl methacrylate and the like; cycloalkyl acrylates such as cyclohexyl acrylate, 2-methylcyclohexyl acrylate and the like; aryl methacrylates such as phenyl methacrylate, benzyl methacrylate and the like; aryl acrylates such as phenyl acrylate, benzyl acrylate and the like; dialkyl esters of dicarboxylic acids such as diethyl maleate, diethyl fumarate, diethyl itaconate and the like; hydroxyalkyl acrylates or methacrylates such as 2-hydroxyethyl methacrylate, 2-hydroxypropyl methacrylate and the like; styrene; styrene derivatives such as $\alpha$-methylstyrene, o-methylstyrene, m-methylstyrene, p-methylstyrene, vinyltoluene and p-methoxystyrene; acrylonitrile; methacrylonitrile; vinyl chloride; vinylidene chloride; acrylamide; methacrylamide; vinyl acetate; and the like. These compounds may be used alone or in admixture of two or more. If the effects of the monoolefinically unsaturated compound upon various properties of the copolymer are taken into consideration, the proportion of the compound in the copolymer is preferably 25-90 mole % and particularly preferably 35-80 mole %.

If the proportion of the monoolefinically unsaturated compound in the copolymer is less than 25 mole %, the proportions of the other constituents in the copolymer, i.e., conjugated diolefinic compound and $\alpha,\beta$-ethylenically unsaturated carboxylic acid increase correspondingly, so that the mechanical properties and alkali-developability of the resist are difficult to control. If the proportion of the monoolefinically unsaturated compound exceeds 90 mole %, the proportion of $\alpha,\beta$-ethylenically unsaturated carboxylic acid decreases correspondingly, so that the solubility of the copolymer in an aqueous alkali solution decreases undesirably.

The said $\alpha,\beta$-ethylenically unsaturated carboxylic acid (C) includes monocarboxylic acids such as acrylic acid, methacrylic acid, crotonic acid and the like; dicarboxylic acids such as maleic acid, fumaric acid, citraconic acid, mesaconic acid, itaconic acid and the like; acid anhydrides such as maleic anhydride, itaconic anhydride and the like; and monoesters of dicarboxylic acids such as monoethyl maleate, monoethyl fumarate, monoethyl itaconate and the like. These $\alpha,\beta$-ethylenically unsaturated carboxylic acids may be used alone or in admixture of two or more, and the proportion thereof in the copolymer is preferably 5-40 mole % and particularly preferably 10-25 mole %. If it is less than 5 mole %, the copolymer becomes difficult to dissolve in an aqueous alkali solution, so that undeveloped portions remain and a satisfactory resist pattern is difficult to make. If it exceeds 40 mole %, the solubility of the copolymer in an aqueous alkali solution becomes so high that it is difficult to prevent the dissolution of unexposed portions, even by the alkali-insolubilizing effect of the 1,2-quinonediazide compound added.

the conjugated diolefinic compound-containing copolymer of this invention is synthesized by a conventional radical solution polymerization method, radical emulsion polymerization method or the like. When it is synthesized by a radical emulsion polymerization method, the chain transfer to polymer takes place easily in the latter stage of polymerization and there is a tendency of forming a solvent-insoluble gel-like substance if the conversion is kept high. If the conversion is kept low in order to avoid the formation of a gel-like substance, the productivity drops, and hence, it is economically disadvantageous.

On the other hand, when the copolymer is synthesized by a radical solution polymerization method, the monomer is diluted with a solvent, and therefore, the chain transfer to polymer in the latter stage of polymerization can be controlled and the polymerization can be allowed to proceed to a high polymerization conversion. Therefore, the radical solution polymerization method is excellent as a method of obtaining the copolymer used in this invention. The solvents usable in the radical solution polymerization method include alcohols such as methanol, ethanol and the like; ethers such as tetrahydrofuran and the like; glycol ethers such as ethylene glycol monomethyl ether and the like; Cellosolve esters such as methyl Cellosolve acetate, ethyl Cellosolve acetate and the like; aromatic hydrocarbons; ketones; esters; and the like. Depending on the object, a plurality of solvents may be used in admixture. Among these solvents, alcohols are particularly preferred.

As the polymerization catalyst, conventional radical polymerization initiators may be used, for example, azo compounds such as 2,2'-azobisisobutyronitrile, 2,2'-azobis(2,4-dimethylvaleronitrile), 2,2'-azobis(4-methoxy-2,4-dimethylvaleronitrile) and the like; organic peroxides such as benzoyl peroxide, lauroyl peroxide, t-butyl peroxypivalate, 1,1-bis(t-butylperoxy)-cyclohexane and the like; and hydrogen peroxide. When a peroxide is used as a radical polymerization initiator, it may be used as a redox type initiator in combination with a reducing agent.

The copolymer having a narrow composition distribution used for the purpose of enhancing the photosensitivity can be produced by portionwise or continuously adding the monomers to be copolymerized to the polymerization system in the above-mentioned radical solution polymerization method or radical emulsion polymerization method according to the respective reactivity ratios. That is to say, the composition distribution can be controlled by allowing a monomer or monomers having a lower reactivity ratio to be present in a high proportion in the early stage of polymerization and adding a monomer or monomers having a higher reactivity ratio to the system with the progress of polymerization. It is well-known that the reactivity ratio can be determined from Q value which is a characteristic value relating to resonance stability of monomer and e value which is a characteristic value relating to polarity of monomer, both being proposed by Alfrey-Price. As to equations for determining the composition of multi-component polymer formed at any instance by using these Q and e values, discussions are made in "High Polymers" Vol. XVIII, "Copolymerization" edited by G. E. Ham, pp. 30-37 (1964), John Wiley and Sons, Inc. and hence the determination method is well-known.

A copolymer having a narrow composition distribution can also be produced by previously mixing the monomers to be copolymerized and adding the monomer mixture to the polymerization system at a rate lower than the polymerization velocity of the polymerization system, in the above-mentioned radical solution polymerization method, radical emulsion polymerization method, etc. In this case, the polymerization conversion is always close to 100% because the addition rate of the monomer mixture is lower than the polymerization velocity, and hence, the copolymer composition during the polymerization period can always be equalized to the composition ratio of the monomer mixture, whereby the copolymer composition can be narrowed.

Copolymer composition distribution can be determined by measuring the standard deviations of the copolymerized proportions of individual copolymer components at any plural times during the polymerization reaction. By making the standard deviations 3 or less, preferably 2 or less, a photosensitive resin composition having a high photosensitivity can be obtained.

Among the above-mentioned processes for producing a copolymer having a narrow composition distribution, particularly preferably is a process which comprises, in the radical solution polymerization method, portionwise or continuously adding the monomers to be copolymerized to the polymerization system according to the reactivities of the monomers. This process uses no emulsifier unlike the radical emulsion polymerization method, so that the copolymer obtained is not contaminated by impurities. Further, the period of time required for the production of a copolymer can be shortened as compared with the process using a monomer mixture formed by previously mixing the monomers to be copolymerized.

The intrinsic viscosity $[\eta]$ of the copolymer used in this invention as measured in tetrahydrofuran at 30° C. is 0.01-1 dl/g, preferably 0.01-0.5 dl/g and more preferably 0.01-0.3 dl/g.

If the intrinsic viscosity $[\eta]$ exceeds 1 dl/g, the velocity of dissolution in an aqueous alkali solution becomes very low, so that the developing time becomes impractically long. If the intrinsic viscosity $[\eta]$ is less than 0.01 dl/g, the rate of dissolution in an aqueous alkali solution becomes so high that the yield of residual film thickness drops and the pattern-leaning phenomenon becomes remarkable.

Since the degree of polymerization of the resultant copolymer is inversely proportional to the square root of the concentration of radical polymerization initiator, the intrinsic viscosity $[\eta]$ of the copolymer can be allowed to fall in the range of 0.01-1 dl/g by appropriately controlling the amount of the radical polymerization initiator added. Further, in order to adjust the intrinsic viscosity $[\eta]$ of the copolymer to 0.01-1 dl/g, a chain transfer agent conventionally used in polymerization systems, for example, a mercaptan such as n-dodecylmercaptan, t-dodecylmercaptan or the like or a halogenated compound such as carbon tetrachloride, carbon tetrabromide or the like, may be added to the polymerization system.

The 1,2-quinonediazide compounds used in this invention include, for example, 1,2-benzoquinonediazidesulfonic acid esters, 1,2-naphthoquinonediazidesulfonic acid esters, 1,2-benzoquinonediazidesulfonic acid amides, 1,2-naphthoquinonediazidesulfonic acid amides and the like, and known 1,2-quinonediazide compounds may be used as they are. More specifically, the 1,2-quinonediazide compounds mentioned in J. Kosar, "Light-Sensitive Systems", 339-352 (1965), John Wiley and Sons, Inc. (New York) or W. S. De Forest, "Photoresist", 50 (1975), McGraw-Hill, Inc. (New York) may be used. That is, the said compounds include phenyl 1,2-benzoquinonediazide-4-sulfonate, 1,2,1',2'-di(benzoquinonediazide-4-sulfonyl)-dihydroxybiphenyl, 1,2-benzoquinonediazide-4-(N-ethyl-N-$\beta$-naphthyl)-sulfonamide, cyclohexyl 1,2-naphthoquinonediazide-5-sulfonate, 1-(1,2-naphthoquinonediazide-5-sulfonyl)-3,5-dimethylpyrazole, 4'-hydroxydiphenyl-4''-azo-$\beta$-naphthol 1,2-naphthoquinonediazide-5-sulfonate, N,N-di(1,2-naphtoquinonediazide-5-sulfonyl)-aniline, 2'-(1,2-naphthoquinonediazide-5-sulfonyloxy)-1-hydroxyanthraquinone, 2,4-dihydroxybenzophenone 1,2-naphthoquinonediazide-5-sulfonate, 2,3,4-trihydroxybenzophenone 1,2-naphthoquinonediazide-5-sulfonate, a condensate of 2 moles of 1,2-naphthoquinonediazide-5-sulfonic acid chloride and 1 mole of 4,4'-diaminobenzophenone, a condensate of 2 moles of 1,2-naphthoquinonediazide-5-sulfonic acid chloride and 1 mole of 4,4'-dihydroxy-1,1'-diphenylsulfone, a condensate of 1 mole of 1,2-naphthoquinonediazide-5-sulfonic acid chloride and 1 mole of purporogallin, 1,2-naphthoquinonediazide-5-(N-dihydroabietyl)-sulfonamide and the like. The 1,2-quinonediazide compound mentioned in Japanese Patent Publication Nos. 1,935/62; 3,627/62; 13,109/62; 26,126/65; 3,801/65; 5,604/70; 27,345/70 and 13,013/76 and Japanese Patent Application Kokai (Laid-Open) Nos. 96,575/73; 63,802/73 and 63,803/73, may also be used.

These quinonediazide compounds are added preferably in an amount of 5-100 parts by weight, particularly 1-50 parts by weight, per 100 parts by weight of the copolymer. If the amount is less than 5 parts by weight, the amount of a carboxylic acid which is formed upon absorption of light is too small to make different the solubilities of resist composition in an aqueous alkali solution before and after exposure to light, and hence the patterning becomes difficult. If it exceeds 100 parts by weight, the major part of the added 1,2-quinonediazide compound remains unchanged when exposed to light for a short period of time, so that the effect of the compound insolubilizing the rubber in an aqueous alkali solution is yet too high to develope an image. Further, if such a low molecular weight compound is added in a large amount, the film formability and the mechanical properties are deteriorated. Further, the alkali-insolubilizing effect, the solubility in an aqueous alkali solution of the carboxylic acid formed by exposure to light, the ability of the composition to form a resist film, the adhesion of the resist film to a substrate, and the like can be varied depending upon the kind of the 1,2-quinonediazide compound.

The positive type photosensitive resin composition of this invention is used in the form of a solution in a solvent capable of dissolving the above-mentioned copolymer and 1,2-quinonediazide compound. Said solvent includes, for example, glycol ethers such as ethylene glycol monomethyl ether, ethylene glycol monoethyl ether and the like; Cellosolve esters such as methyl Cellosolve acetate, ethyl Cellosolve acetate and the like; aromatic hydrocarbons such as toluene, xylene and the like; ketones such as methyl ethyl ketone, cyclohexanone and the like; and esters such as ethyl acetate, butyl acetate and the like.

These solvents may be used in admixture of several members, taking into consideration the solubilities of the above-mentioned copolymer and 1,2-quinonediazide compound, as well as the evaporation rate of the solvent after the photosensitive resin composition is applied to a substrate and the effect of the coated film on the surface shape of the substrate. Further, if necessary, a storage stabilizer, a dyestuff, a pigment and the like may be added to this photosensitive resin composition.

Furthermore, a polymer which is soluble in an aqueous alkali solution and compatible with the positive type photosensitive resin composition of this invention can be incorporated into the positive type photosensitive resin composition to enhance the mechanical strength of a resist film and improve the heat resistance thereof. Said polymer includes polyhydroxystyrene, polyaminostyrene, styrene-maleic anhydride copolymer resin and the like. However, it is impossible to mix a polymer insoluble in an aqueous alkali solution, because when a polymer insoluble in an aqueous alkali solution is present in a resist, the part in which the polymer is present remains undeveloped even when the 1,2-quinonediazide compound present in the composition has been converted into a carboxylic acid upon irradiation with a light and has become soluble in a developing solution consisting of an aqueous alkali solution, and the undeveloped part remains in a resist pattern, and an insoluble polymer dispersed in a developing solution attaches to the resist surface to cause unsatisfactory articles.

As the developing solution for the positive type photosensitive resin composition of this invention, an aqueous solution of an inorganic alkali such as sodium hydroxide, potassium hydroxide, sodium carbonate, sodium silicate, sodium metasilicate, aqueous ammonia or the like or an aqueous solution of an organic alkali including primary amines such as ethylamine, n-propylamine and the like; secondary amines such as diethylamine, di-n-propylamine and the like; tertiary amines such as triethylamine, methyldiethylamine and the like; alcoholamines such as dimethylethanolamine, triethanolamine and the like; quaternary ammonium hydroxides such as tetramethylammonium hydroxide, tetraethylammonium hydroxide and the like; cyclic amines such as pyrrole, piperidine, 1,8-diazabicyclo(5,4,0)-7-undecene, 1,5-diazabicyclo(4,3,0)-5-nonane and the like; and so on, as well as aqueous solutions obtained by adding an appropriate quantity of a water-soluble organic solvent such as an alcohol, for example, methanol, ethanol or the like, or a surfactant to the above-mentioned aqueous solution, can be used preferably.

The positive type photosensitive resin composition of this invention is particularly useful as a material for integral circuit and also can be coated on a metallic support such as aluminum to be used for offset printing plate and for production of a mask.

This invention will be more concretely explained below referring to Examples and the accompanying drawings.

Figure 2:
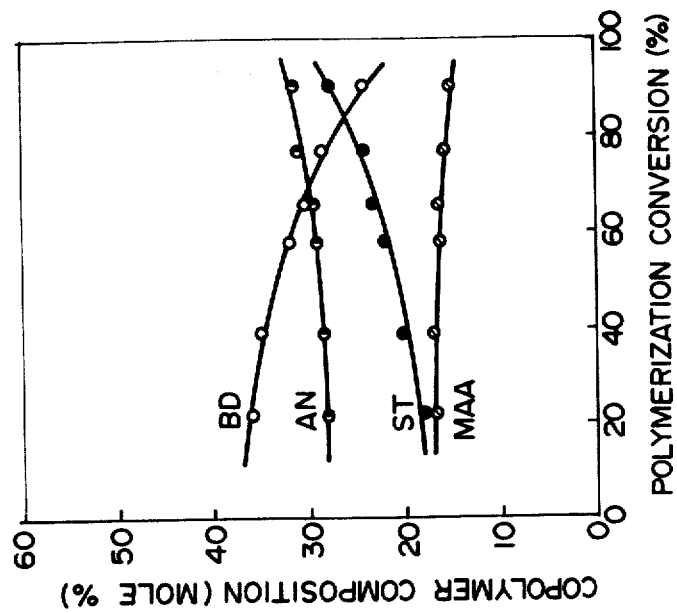
FIG. 2 is a graph illustrating the relation between polymerization conversion and copolymer composition in the production of the same copolymer as above, wherein the monomers are not continuously added.

This invention is not limited to the Examples.

EXAMPLE 1

After replacing the air in a pressure bottle having a capacity of 500 ml with dry nitrogen, 4.5 g of 2,2'-azobisisobutyronitrile, 150 g of methanol, 70 g of methyl methacrylate (MMA), 15 g of styrene (ST), 27 g of methacrylic acid (MAA) and 38 g of 1,3-butadiene (BD) were charged thereinto. After crown-capping the bottle, it was dipped in a polymerization bath controlled at a temperature of 70° C. and reaction was effected for 20 hours while rotating the bottle. The contents were poured into petroleum ether to precipitate a copolymer. After recovering the copolymer, it was thoroughly washed with petroleum ether and dried for 15 hours in a hot-air vacuum drier controlled at a temperature of 50° C.

The composition of the copolymer thus obtained was BD/MMA/ST/MMA=35.5/37.8/11.2/15.5 mole %, and its intrinsic viscosity [$\eta$] was 0.2 dl/g as measured at 30° C. in tetrahydrofuran (all the intrinsic viscosities appearing hereinafter were measued under the same conditions as above).

In 77.5 g of ethyl Cellosolve acetate were dissolved 19.5 g of the copolymer thus obtained and 3 g of 2,4-dihydroxybenzophenone 1,2-naphthoquinonediazide-5-sulfonate, and then the solution was filtered through a millipore filter having a pore diameter of 0.45 μm to obtain a positive type resist.

This resist was coated onto a silicon dioxide film wafer by the use of a spinner and then prebaked for 30 minutes at 80° C. in an oven to obtain a coating film having a film thickness of 1.2 μm. A test pattern mask manufactured by Toppan Insatsu K.K. was intimately contacted with the wafer and irradiated for 15 seconds with ultraviolet rays having an intensity of 50 W/m$^2$ at 365 nm. Then it was developed at 20° C. for 40 seconds with 1.5% by weight aqueous solution of potassium hydroxide. Thus, it was found that a pattern having a line width of 0.7 μm could be resolved.

After washing the pattern with water, it was etched, without drying, with an aqueous solution of hydrogen fluoride/ammonium fluoride as an etchant, whereby etching could be completed in a state almost substantially free from permeation. From this fact, it was confirmed that the adhesiveness of the positive type resist of this invention to a base board was excellent even if no adhesion promoter was used at all and no film-hardening treatment was carried out.

After forming a coating film on a wafer and drying the film at 80° C. for 30 minutes in an oven, the surface of the film was notched with a knife edge and observed by means of an optical microscope. As a result, no fine breaking nor scattering of the resist was observed at all.

COMPARATIVE EXAMPLE 1

A copolymer having a composition of MMA/-MAA=82.5/17.5 mole % and an intrinsic viscosity [η] of 0.15 dl/g was synthesized by the same procedure as in Example 1, and it was evaluated in the same manner as in Example 1. As a result, it was poor in adhesion to silicon wafer, and the pattern peeled off.

COMPARATIVE EXAMPLE 2

A copolymer of BD/ST=45/55 mole % having an instrinsic viscosity [η] of 0.25 dl/g was synthesized in the same manner as in Example 1, except that toluene was substituted for the solvent. Said copolymer was added 25% by weight to the MMA/MAA copolyemr of Comparative Example 1, and a positive type resist photosensitive solution was prepared from the resulting mixture according to Example 1 and evaluated, to find that the adhesion to a silicone wafer was somewhat improved, but the developability was bad and almost all patterns could not be developed.

EXAMPLES 2–6

The copolymers shown in Table 1 were synthesized by the same procedure as in Example 1, and evaluated in the same manner as in Example 1.

TABLE 1

| Example No. | Copolymer composition (mole %) | [η] (dl/g) | Resolution (μm) | Adhesion to silicon water |
|---|---|---|---|---|
| 2 | BD/EMA/MAA = 16.4/62.0/21.6 | 0.23 | 1.0 | Excellent |
| 3 | BD/n-BMA/MAA = 15.5/65.3/19.2 | 0.25 | 0.7 | Excellent |
| 4 | BD/MMA/AN/MAA = 27.3/31.8/22.8/18.1 | 0.19 | 0.9 | Excellent |
| 5 | BD/MMA/AA = 21.1/63.6/15.3 | 0.16 | 0.6 | Excellent |
| 6 | IP/MMA/MAA = 31.2/51.1/17.4 | 0.18 | 0.9 | Excellent |

Note:
EMA = ethyl methacrylate;
n-BMA = n-butyl methacrylate;
AN = acrylonitrile;
AA = acrylic acid;
IP = isoprene.

As shown in Table 1, all the samples exhibited a good resolution without peeling of the pattern from the wafer in the course of development, gave a small side etch at the time of etching, and were excellent in adhesion to wafer. When the resist surface was notched with knife edge, no fine breaking was observed at all.

EXAMPLE 7

After replacing the air in a pressure bottle having a capacity of 500 ml with nitrogen, 0.6 g of 2,2'-azobisisobutyronitrile, 147 g of methanol, 60 g of MMA, 36 g of AA and 24 g of BD were charged thereinto. After crown-capping the bottle, it was dipped in a polymerization bath and reaction was effected at 70° C. for 24 hours. The contents were poured into petroleum ether to precipitate and purify the product, after which it was heated and vacuum-dried at 40° C. for 20 hours. The copolymer thus obtained had a composition of BD/MMA/AA=30.3/46.0/23.7 mole % and an intrinsic viscosity [η] of 0.45 dl/g.

In 85 g of ethyl Cellosolve acetate were dissolved 12.5 g of the above-mentioned copolymer and 2.5 g of p-tolyl 1,2-naphthoquinonediazide-5-sulfonate, and then the solution was filtered through a millipore filter having a pore diameter of 0.45 μm to produce a resist. The resist was coated onto a silicon dioxide film wafer by means of a spinner to obtain a resist layer having a film thickness of 0.9 μm. In the same manner as in Example 1, a test pattern manufactured by Toppan Insatsu K.K. was intimately contacted with the wafer and irradiated for 15 seconds with ultraviolet rays, after which the resulting image was developed at 20° C. for 60 seconds in 1.5% by weight aqueous solution of potassium hydroxide. In the developed image, a line having a width of 1.5 μm was resolved. No permeation occurred at the time of etching, and the resist was well bonded to the silicon wafer. When the resist surface was notched with a knife edge, no fine breaking was not found at all.

EXAMPLE 8

After completely replacing the air in an autoclave having a capacity of 100 liters with nitrogen, 43 liters of methanol containing 680 g of 2,2'-azobisisobutyronitrile (AIBN) dissolved therein was charged thereinto. Subsequently, 9.1 kg of ST, 5.7 kg of AN, 3.4 kg of MAA and 230 g of t-dodecylmercaptan were charged into the autoclave, after which 1.8 kg of BD was charged with gentle stirring. The polymerization was started at 70° C. After one hour, there was started the continuous addition of BD at a rate of 400 g/hr and MAA at a rate of 230 g/hr while keeping the above-mentioned temperature. The period of continuous addition time was 5 hours for BD and 3 horus for MAA. After completion of the continuous addition of BD, the reaction was further continued for 10 hours. After the reaction, a part of the contents was taken out and poured into a large excess of petroleum ether to recover the copolymer. It was thoroughly washed with petroleum ether and heated and vacuum-dried at a constant temperature of 50° C. for 15 hours to obtain the desired copolymer. Separately, the contents were portionwise sampled with a progress of reaction to measure the polymerization conversion, and, at the same time, the copolymer was recovered according to the above-mentioned procedure to examine the copolymer composition.

Figure 1:
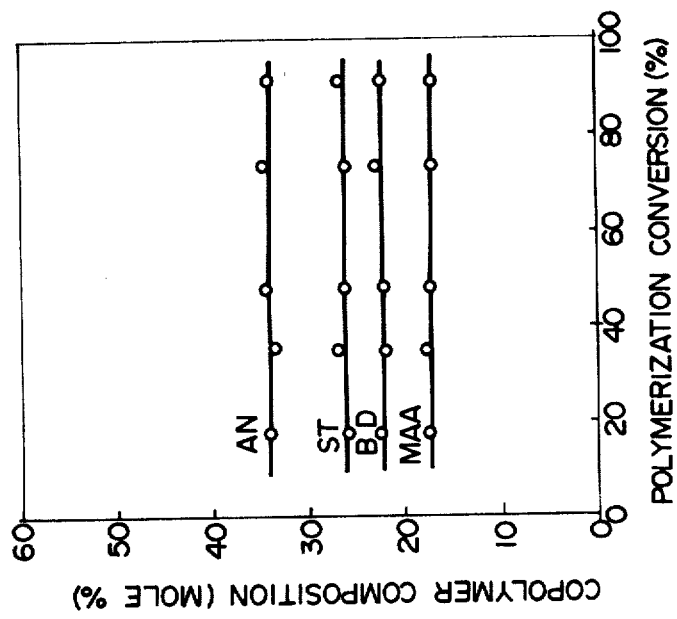
FIG. 1 is a graph illustrating relations between polymerization conversion and copolymer composition in the production of a 1,3-butadiene (BD)/styrene (ST)/acrylonitrile (AN)/methacrylic acid (MAA) copolymer, wherein BD and MAA are continuously added during the polymerization.

The relations between polymerization conversion and copolymer composition are shown in FIG. 1, and the standard deviations of said composition are shown in Table 2. According to FIG. 1 or Table 2, it could be judged that the copolymer composition was changed only to a small extent even if the polymerization conversion changed, and the copolymer obtained in the present Example had a narrow composition distribution.

In 180 g of ethyl Cellosolve acetate were dissolved 50 g of the copolymer having a narrow composition distribution and 10 g of 2,4-dihydroxybenzophenone 1,2-naphthoquinonediazide-5-sulfonate, and then the solution was filtered through a millipore filter having a pore diameter of 0.45 μm to prepare a photosensitive solution. This solution was coated on a silicon dioxide film on a silicon wafer by means of a spinner and then prebaked at 80° C. for 30 minutes. A test pattern mask manufactured by Toppan Insatsu K.K. was intimately contacted with the wafer and irradiated for 8 seconds with ultraviolet rays having an intensity of 50 W/m² at 365 nm. Thus, it was confirmed that a pattern having a width of 0.7 μm could be resolved by a development at 20° C. for 40 seconds with a developing solution consisting of a mixture of 1.0 g of 1,8-diazabicyclo-(5,4,0)-7-undecene and 199 g of deionized water.

When the developed pattern was wet-etched with an aqueous solution of hydrogen fluoride and ammonium fluoride without post-baking, substantially no permeation occurred, and it exhibited an excellent adhesion to the silicon wafer though no adhesion promoter was used. After forming a coating film on the wafer and prebaking it, the resist surface was notched with a knife edge and observed by means of an optical microscope. As a result, no fine breaking nor scattering of the resist was observed at all.

EXAMPLE 9

After charging 43 liters of methanol containing 680 g of AIBN, 9.1 kg of ST, 5.7 kg of AN, 4.1 kg of MAA and 230 g of t-dodecylmercaptan into an autoclave having a capacity of 100 liters, 3.8 kg of BD was charged thereinto with gentle stirring and polymerization reaction was carried out at 70° C. for 20 hours. The relations between polymerization conversion and copolymer composition were as shown in FIG. 2, and the standard deviations of the composition were as shown in Table 2. By comparing them with those in FIG. 1, it was confirmed that the copolymer composition was uneven.

After completion of the reaction, a copolymer was obtained in quite the same manner as in Example 8, and a photosensitive solution was prepared therefrom. This solution was coated on a silicon dioxide film on a silicon wafer by means of a spinner and then prebaked, after which a mask was intimately contacted therewith, and the resulting assembly was irradiated with ultraviolet rays for 8 seconds and developed with a developing solution containing 1,8-diazabicyclo(5,4,0)-7-undecene. However, a 0.7 μm pattern could not be resolved. It was confirmed that an irradiation with ultraviolet rays for 15 seconds was necessary for resolving the 0.7 μm pattern. Adhesiveness to silicon wafer and breaking of resist on the notched resist surface were, of course, similar to those in Example 8.

EXAMPLE 10

Figure 3:
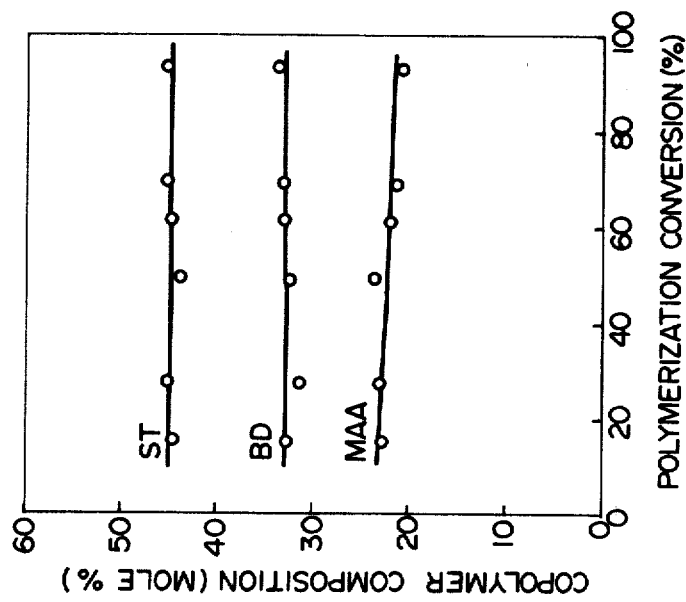
FIG. 3 is a graph illustrating relations between polymerization conversion and copolymer composition in the production of BD/ST/MAA copolymer, wherein BD and MAA are continuously added.

After completely replacing the air in an autoclave having a capacity of 100 liters with nitrogen, 32 liters of methanol containing 1.3 kg of AIBN, 19.7 kg of ST, 3.3 kg of MAA and 500 g of t-dodecylmercaptan were charged into the autoclave and then 3.3 kg of BD was charged thereinto with gentle stirring. The inner temperature was elevated to 70° C. to start polymerization, one hour after which the addition of BD and MAA was started at a rate of 330 g/hr. After continuing the addition of these monomers over a period of 10 hours, the reaction was further continued for 13 hours. In the course of the reaction, a small portion of the contents was sampled to measure the polymerization conversion and, at the same time, the copolymer formed was recovered from the sample to examine the composition thereof. The results were as shown in FIG. 3 and Table 2, from which it was confirmed that a copolymer having a narrow composition distribution was formed.

In quite the same manner as in Example 8, the copolymer produced was recovered, and a photosensitive solution was prepared therefrom, after which the period of ultraviolet ray-irradiation time necessary for resolving a 0.7 μm pattern was determined. The result was 10 seconds. There were no problems at all regarding its adhesion to silicon wafer and breaking of resist on the resist surface.

EXAMPLE 11

Figure 4:
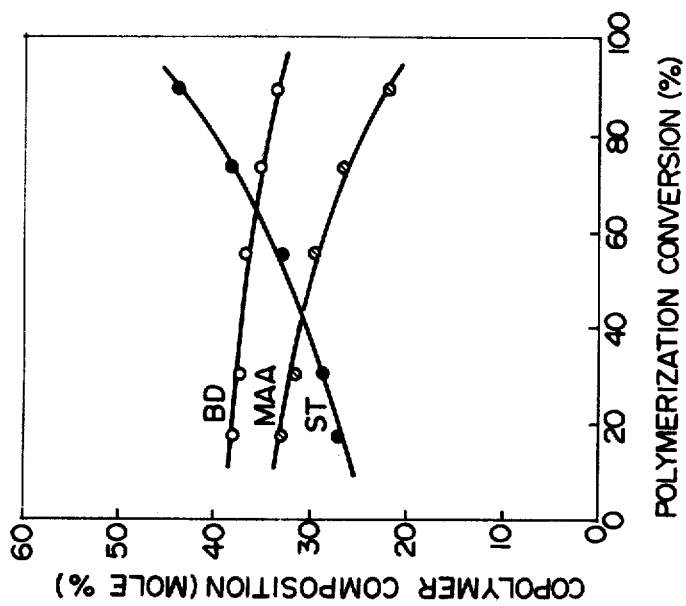
FIG. 4 is a graph illustrating relations between polymerization conversion and copolymer composition in the production of the same copolymer as in FIG. 3, wherein the monomers are not continuously added.

In quite the same manner as in Example 10, 32 liters of methanol containing 1.3 kg of AIBN was charged into an autoclave having a capacity of 100 liters, after which 19.7 kg of ST, 6.6 kg of MAA, 500 g of t-dodecylmercaptan and 6.6 kg of BD were successively charged and the mixture was subjected to polymerization reaction at 70° C. for 24 hours. The relations between polymerization conversion and copolymer composition were as shown in FIG. 4 and Table 2. According to FIG. 4 or Table 2, it was confirmed that copolymers different in composition were formed with a progress of the polymerization.

In quite the same manner as in Example 8, the copolymer was recovered and a photosensitive solution was prepared therefrom, and the period of ultraviolet ray-irradiation time necessary for resolving a 0.7 μm pattern was determined. The result was 18 seconds.

TABLE 2

| Monomer component | Standard deviation of composition distribution in the copolymerization period | | | |
|---|---|---|---|---|
| | Example 8 | Example 9 | Example 10 | Example 11 |
| BD | 0.4 | 4.1 | 0.7 | 1.9 |
| ST | 0.4 | 3.1 | 0.6 | 5.9 |

TABLE 2-continued

| | Standard deviation of composition distribution in the copolymerization period | | | |
|---|---|---|---|---|
| Monomer component | Example 8 | Example 9 | Example 10 | Example 11 |
| AN | 0.4 | 1.6 | — | — |
| MAA | 0.3 | 0.5 | 1.1 | 4.1 |

What is claimed is:

1. A positive photosensitive resin composition consisting of an admixture of 5-100 parts by weight of a 1,2-quinonediazide compound per 100 parts of a copolymer consisting essentially of (A) 5-60 mole % of a conjugated diolefinic compound, (B) 25-90 mole % of a monoolefinically unsaturated compound and (C) 5-40 mole % of an α,β-ethylenically unsaturated carboxylic acid and an additive selected from the group consisting of a storage stabilizer, a dyestuff, a pigment, a polymer soluble in an aqueous alkali solution and a mixture thereof.

2. A positive type photosensitive resin composition consisting of an admixture of 5-100 parts by weight of a 1,2-quinonediazide compound per 100 parts of a copolymer consisting essentially of (A) 5-60 mole % of a conjugated diolefinic compound, (B) 25-90 mole % of a monoolefinically unsaturated compound and (C) 5-40 mole % of an α,β-ethylenically unsaturated carboxylic acid.

3. A photosensitive resin composition according to claim 2, wherein said copolymer consists of (A) 10-40 mole % of a conjugated diolefinic compound, (B) 35-80 mole % of a monoolefinically unsaturated compound and (C) 10-25 mole % of an α,β-ethylenically unsaturated carboxylic acid.

4. A photosensitive resin composition according to claim 2, wherein said copolymer has an intrinsic viscosity of 0.01-1 dl/g as measured in tetrahydrofuran at 30° C.

5. A photosensitive resin composition according to claim 2, wherein said copolymer has an intrinsic viscosity of 0.01-0.3 dl/g as measured in tetrahydrofuran at 30° C.

6. A photosensitive resin composition according to claim 2, 3, 4 or 5 wherein said conjugated diolefinic compound is at least one member selected from the group consisting of 1,3-butadiene, isoprene, chloroprene and dimethylbutadiene.

7. A photosensitive resin composition according to claim 2, 3, 4 or 5, wherein said conjugated diolefinic compound (A) is 1,3-butadiene or isoprene.

8. A photosensitive resin composition according to claim 2, 3, 4 or 5, wherein said monoolefinically unsaturated compound (B) is at least one member selected from the group consisting of alkyl methacrylates, alkyl acrylates, cycloalkyl methacrylates, cycloalkyl acrylates, aryl methacrylates, aryl acrylates, dialkyl dicarboxylates, hydroxyalkyl acrylates or methacrylates, styrene, styrene derivatives, acrylonitrile, methacrylonitrile, vinyl chloride, vinylidene chloride and vinyl acetate.

9. A photosensitive resin composition according to claim 2, 3, 4 or 5, wherein said monoolefinically unsaturated compound (B) is at least one compound selected from the group consisting of methyl methacrylate, ethyl methacrylate, n-butyl methacrylate, styrene and acrylonitrile.

10. A photosensitive resin composition according to claim 2, 3, 4 or 5, wherein said α,β-ethylenically unsaturated carboxylic acid (C) is at least one compound selected from the group consisting of acrylic acid, methacrylic acid, crotonic acid, maleic acid, fumaric acid, citraconic acid, mesaconic acid, itaconic acid, maleic anhydride, itaconic anhydride, monoethyl maleate and monoethyl fumarate.

11. A photosensitive resin composition according to claim 2, 3, 4 or 5, wherein said α,β-ethylenically unsaturated carboxylic acid (C) is acrylic acid or methacrylic acid.

12. A photosensitive resin composition according to claim 2, 3, 4 or 5, wherein said 1,2-quinonediazide compound is a 1,2-benzoquinonediazidesulfonic acid ester, a 1,2-naphthoquinonediazidesulfonic acid ester, a 1,2-benzoquinonediazidesulfonic acid amide or a 1,2-naphthoquinonediazidesulfonic acid amide.

13. A photosensitive resin composition according to claim 2, 3, 4 or 5 wherein the amount of said 1,2-quinonediazide compound is 10-50 parts by weight per 100 parts by weight of said copolymer.

14. A photosensitive resin composition according to claim 2, wherein the copolymer is a copolymer having a narrow composition distribution prepared under such conditions that the standard deviations of the copolymerized proportions of individual copolymer components at any plural times during the polymerization reaction are 3 or less.

* * * * *